United States Patent [19]

McDermott

[11] Patent Number: 5,847,588
[45] Date of Patent: Dec. 8, 1998

[54] PROGRAMMABLE MULTIPLE CCD CLOCK SYNTHESIZER

[75] Inventor: Bruce C. McDermott, Penfield, N.Y.

[73] Assignee: Eastman Kodak Company, Rochester, N.Y.

[21] Appl. No.: 774,486

[22] Filed: Dec. 30, 1996

[51] Int. Cl.[6] .............................. H03K 17/00; H03K 5/13
[52] U.S. Cl. ......................... 327/144; 327/141; 327/172; 327/258; 327/105; 377/77; 377/78
[58] Field of Search ..................................... 327/105, 117, 327/141, 261, 172, 263, 258, 276, 277, 144, 153, 271; 377/77, 78

[56] References Cited

U.S. PATENT DOCUMENTS

| | | | |
|---|---|---|---|
| 4,700,350 | 10/1987 | Douglas et al. | 327/258 |
| 5,039,950 | 8/1991 | McDermott | 327/144 |

Primary Examiner—Dinh Le
Attorney, Agent, or Firm—David M. Woods; William F. Noval

[57] ABSTRACT

The clock synthesizer includes an oscillator section for providing a train of pulses corresponding to the transitions of a master clock signal, a first register coupled to the oscillator for dividing the train of pulses by a fixed integer to produce a plurality of first phase shifted signals corresponding in number to said integer, and a plurality of second shift registers corresponding in number to the integer and each having a clocking input coupled to a respective one of the first phase shifted signals. The second registers produce a plurality of second phase shifted signals having leading edge transitions separated from each other by displacements corresponding to the transitions of the master clock signal. The second phase shifted signals are then combined to generate the lower frequency clock pulses, which may be used, e.g., in the clocking of a charge coupled device image sensor.

17 Claims, 8 Drawing Sheets

PROGRAMMABLE MULTIPLE CCD CLOCK SYNTHESIZER

CROSS-REFERENCE TO RELATED APPLICATION(S)

Reference is made to commonly assigned copending application Ser. No. 08/777,430, entitled "Programmable Clock Generator for an Imaging Device" and filed on Dec. 30, 1996, in the names of David M. Charneski and Eugene M. Petilli, which is assigned to the assignee of this application.

1. Field of the Invention

The present invention relates to the field of digital clock signal synthesizers and, more particularly, to a synthesizer for generating multiple clock signals with improved programmable adjustability of the clock signals.

2. Background of the Invention

Various systems require accurate multiple clock signals. One particular system is an imaging system that incorporates a CCD imager that is scanned (activated) using multiple clock signals to read out lines of charges that are a function of an image. As the frequency (speed) of operation of CCD imaging systems increase, the performance demands placed on the digital logic associated with such systems increases proportionately. Edge positioning accuracy and adjustability for clocking the CCD and operating the associated signal processing becomes critical. Such adjustments are required to optimize and compensate for clock driver performance and CCD imager performance, and to optimize the signal processing signal to noise ratio.

One known approach to a synthesizer logic design is shown in U.S. Pat. No. 5,039,950, as illustrated in FIGS. 1A and 1B. Within the synthesizer an oscillator 10 provides a train of pulses corresponding to a base signal, in this case a base signal having a frequency that is 8 times a system clock (ECK). The signal from the oscillator 10 is coupled to an input of a load section comprising an AND gate 14 and a D-type flip flop 15. The D-input of the flip flop 15 receives a load signal. The Q output of the flip flop 15 is connected to the second input of the AND gate 14, which in turn is connected to buffers 16A . . . 16D. A plurality of delay devices 17, formed of differing lengths of cables, are coupled to the oscillator 10 through buffers 16B . . . 16D. When the load signal activates the AND gate 14, each cable provides a different delay to the train of pulses from the oscillator 10 and in turn provides one of a plurality of delayed clocking signals CK1 . . . CK3. Meanwhile, the buffer 16A provides an undelayed clocking signal CK0. A plurality of registers 18, corresponding in number to the number of clocking signals CK0 . . . CK3, each receive on their clocking inputs either the undelayed clocking signal CK0 or the clocking signal from an associated one of the plurality of delay devices.

A binary number N is recirculated in each of the plurality of registers 18 as a function of the associated clocking signal. The registers 18 thus provide at their output taps a sequence of pulses each having a leading edge displacement defined by 1 divided by the number of outputs from the plurality of delay devices, times the number of outputs per register, times the element clock period. Therefore, for the circuit shown in FIG. 1A, the leading edge of each tap output is displaced exactly 1/32nd of an element time. For the particular clocking cycle used, it can be seen that for every 1/32nd of an element time there is a pulse commencing a 0 to 1 transition at one of the taps of the four shift registers. In order to generate the desired output waveforms, the tap outputs of the shift registers 18 are logically combined using waveform generating logic 19 including, e.g., flip flops and/or logic gates, as shown in the FIG. 1B. To allow system adjustment, a physical interconnection matrix 20 is placed between the multi-tap outputs of the shift registers 18 and the waveform generation logic 19. By selectively soldering wires at the X-Y interconnection points of the interconnection matrix 20, the source clocks are chosen that drive the waveform generating logic 19.

The prior art exemplified by U.S. Pat. No. 5,039,950 exhibits two limitations. First, delay lines are used to establish the time relationships between recirculating shift registers in order to generate pulses that signify multiple divisions of the primary clock period (e.g., the CCD element period). Second, a physical X-Y matrix made up of circuit board traces is used to facilitate choosing pulses that create output clock waveforms. The first limitation requires expensive delay line devices and a fixed clock rate due to the fixed delays and the second limitation restricts programmability due to solder connections and is not suitable for cost-effective monolithic execution.

SUMMARY OF THE INVENTION

The present invention is directed to overcoming one or more of the problems set forth above. Briefly summarized, according to one aspect of the present invention, a programmable clock synthesizer circuit comprises first means for dividing a higher frequency clock by a first integer to produce a first integer number of first phase shifted signals, second means for dividing each of the first phase shifted signals by a second integer to produce a second integer number of second phase shifted signals from each said first phase shifted signal, and means for generating said plurality of lower frequency clock pulses from said second phase shifted signals.

Among the advantages of this invention, the master clock may be changed without having to change any of the synthesizer components, expensive delay lines are avoided, and the logic pathways for combining the second phase shifted signals may be easily changed to obtain different lower frequency clock pulse patterns.

These and other aspects, objects, features and advantages of the present invention will be more clearly understood and appreciated from a review of the following detailed description of the preferred embodiments and appended claims, and by reference to the accompanying drawings.

DETAILED DESCRIPTION OF THE INVENTION

Figure 7:
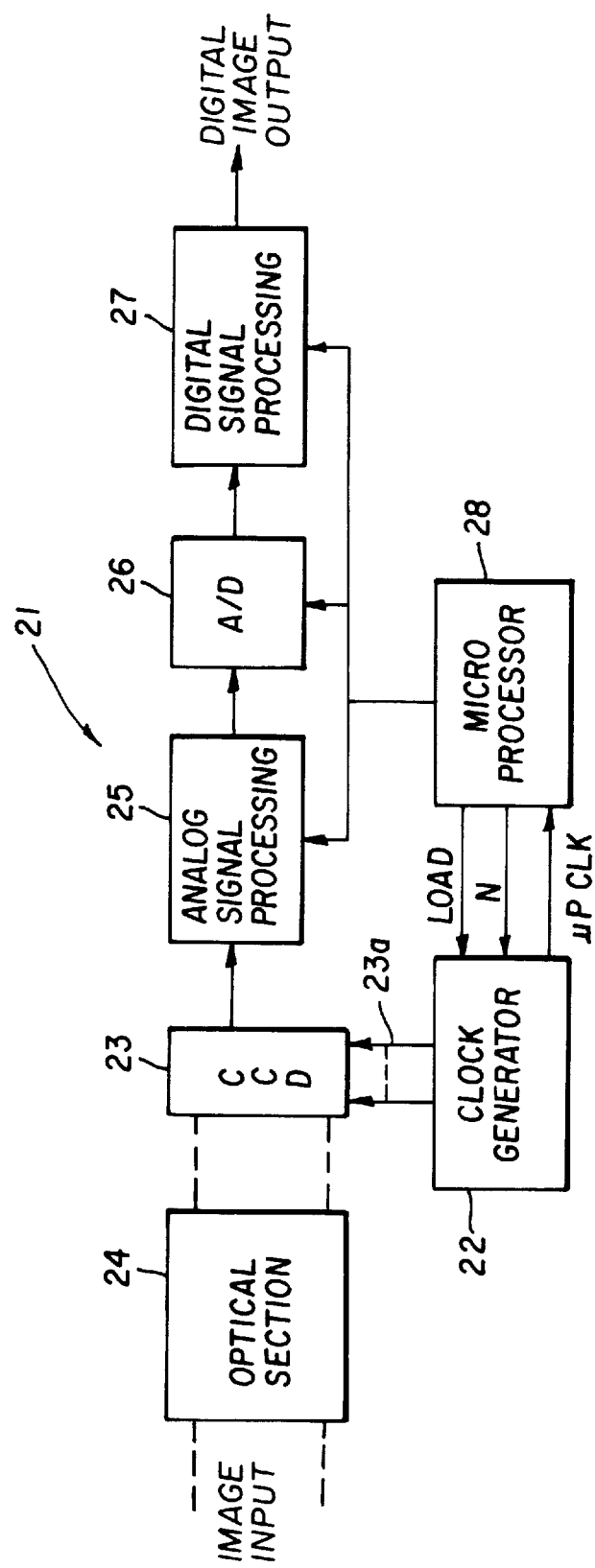
FIG. 7 shows a block diagram of an imaging device incorporating a clock generator of the type shown in FIGS. 2 and 3 according to the invention.

Referring first to FIG. 7, an imaging device 21 is shown in a block diagram incorporating a clock generator 22 according to the invention. The clock generator 22 is used to drive, i.e., "clock", an image sensor 23, such as a charge-coupled device (CCD) sensor, which receives an image of an object through an optical section 24. As is well known, the image sensor 23 requires a number of input clock signals 23a with characteristics specific to the type of sensor employed. The clock signals 23a are used, among other things, to output an image signal to an analog processing section 25, which adjusts the signal, e.g., for black level and gain, and removes noise through correlated double sampling. The image signal is then digitized in an analog-to-digital (A/D) converter 26 and output to a digital signal processing section 27, which may, e.g., apply a known compression algorithm, correct for sensor defects, interpolate for full color (if the sensor 23 is a color sensor), and the like. The digitally processed signal is then available for conventional utilization, e.g., transmission, storage, hard copy output, and so on.

The various elements of the imaging device 21 are controlled by a microprocessor 28. More particularly, the microprocessor 28 provides a load signal LOAD to the clock generator 22 in order to begin a clocking sequence. In addition, the microprocessor 28 supplies a divisor signal N that is used by the clock generator 22 to provide a variable microprocessor clock.

Figure 2:
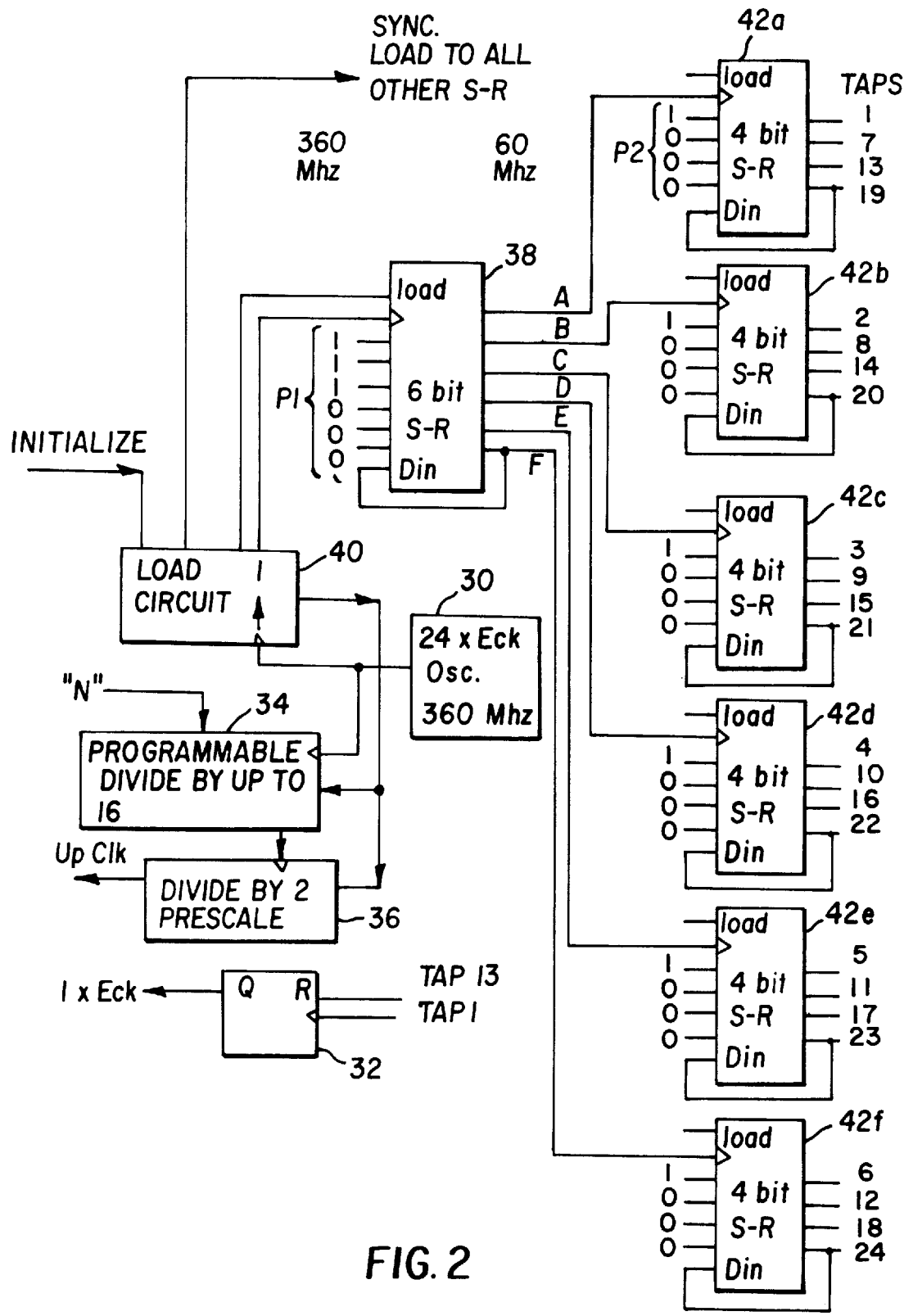
FIG. 2 shows a block diagram of a time slot generator according to the invention.
Figure 3:
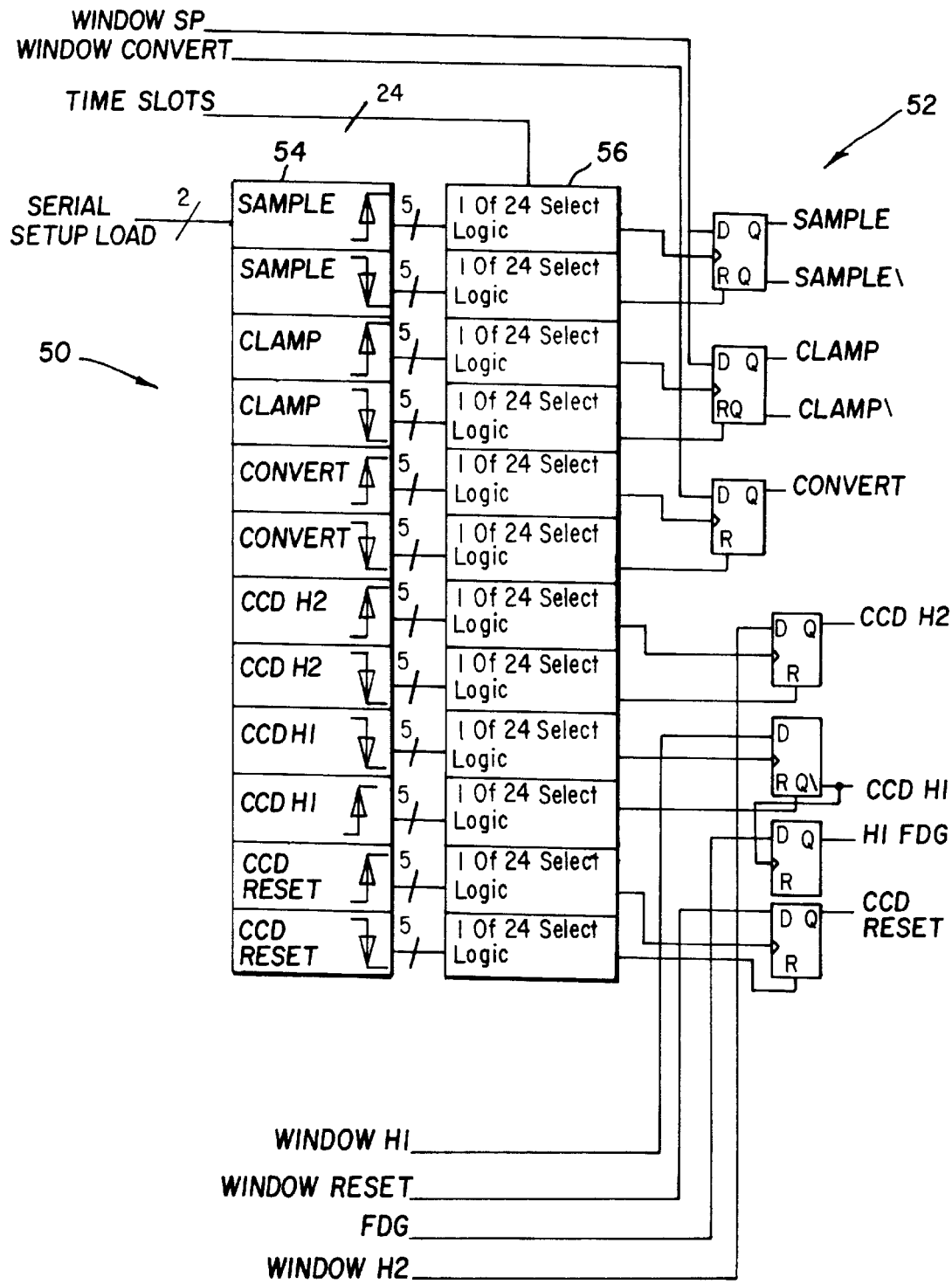
FIG. 3 shows a block diagram of an output waveform generator, which is combined with the time slot generator of FIG. 2 to form the programmable clock synthesizer according to the invention.

The clock generator 22 comprises a time slot generator shown in FIG. 2 connected to an output waveform generator shown in FIG. 3. As shown in this embodiment, the time slot generator generates pulses in increments of 1/24 of the primary clock period, which herein is the CCD element period (the CCD element clock frequency or the pixel readout rate is referred as ECK in the figures). Referring first to FIG. 2, a master oscillator 30 has a master clock frequency that is a multiple of the primary clock period of the CCD sensor 23 (shown in FIG. 7). In the embodiment shown, the master oscillator 30 has a master clock frequency that is 24 times the primary clock frequency (ECK). More specifically, the primary clock frequency is 15 Mhz and the oscillator output is 360 Mhz. A flip flop 32 generates the clock 1X ECK that is used to clock the logic that creates window signals to control horizontal timing of the CCD sensor 23.

A programmable divider 34, which is connected to an output of the master oscillator 30, is programmable by up to 16 based on a divisor signal N that is loaded on power up. The programmable divider 34 clocks a prescale divider 36, which provides a programmable system microprocessor clock by dividing the output of the divider 34 by an integer in order to prescale the microprocessor clock signal. The microprocessor clock, which runs continuously, can be changed based on the desired output data rate, the speed power product of the microprocessor, a desired CCD readout rate, etc.

A parallel loadable, recirculating six-bit shift register 38 provides a plurality of delayed pulse signals A . . . F. This shift register is of the type having a parallel load ability with parallel outputs, a serial shift capability through the register with a serial input, and the ability to be operated at relatively high clocking rates. The F tap output of the shift register is fed back to the data in (Din) terminal. The load input terminal is connected to receive a load signal from a load circuit 40.

Figure 4:
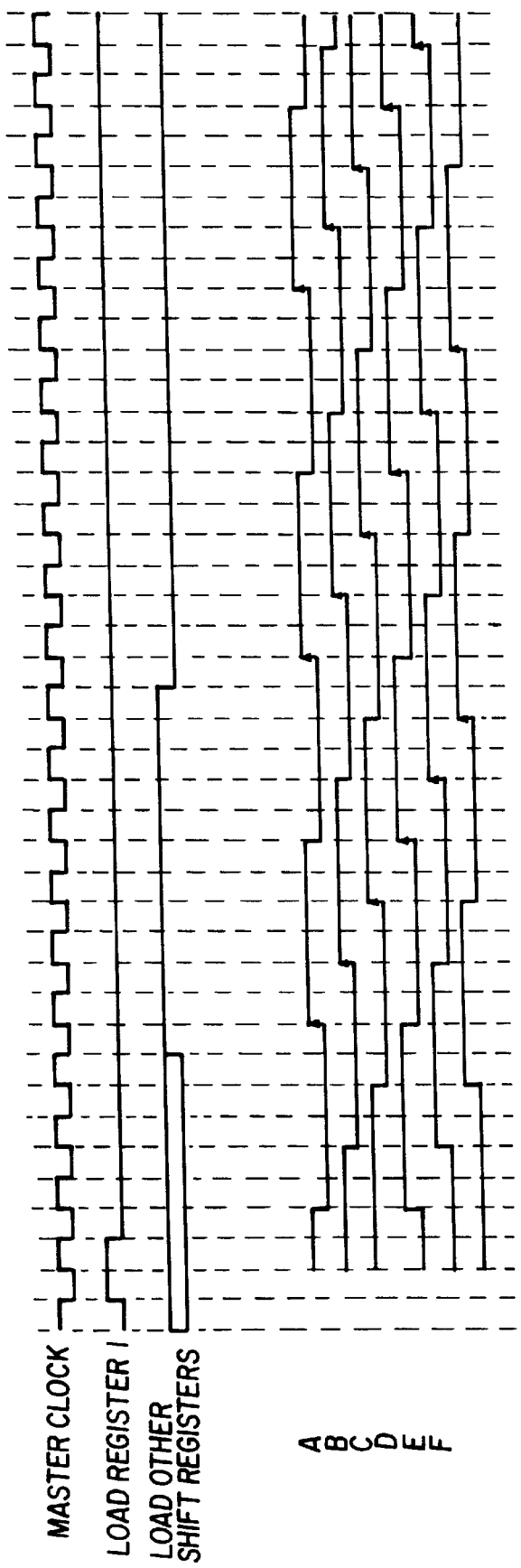
FIG. 4 is a timing diagram showing the output of the first shift register shown in FIG. 2.

A six-bit parallel input pattern P1 is loaded into the shift register 38 during, for example, a horizontal blanking time. In the preferred embodiment, the different output pulse signals of the register 38 are displaced in time from each other by 1/(24 times the primary clock frequency), and the output pulses of each signal pulse at a rate of (24×primary clock frequency)/6, wherein the divisor 6 is determined by the parallel input pattern P1. In this example the fixed binary integer 111000 is loaded into the register 38, and the pulse relationships of the clock signals A . . . F with the master clock and the load pulse are shown in FIG. 4.

The load circuit 40 synchronizes an external load pulse with the master clock frequency by initializing the shift register 38 and the dividers 34 and 36 providing the microprocessor clock. The outputs of the shift register 38 are connected to six parallel loadable, recirculating time slot shift registers 42A . . . 42F. Each shift register 42A . . . 42F is a four-bit register forming a four pulse time slot generator. As with register 38, these shift registers are of the type having a parallel load ability with parallel outputs, a serial shift capability through the register with a serial input, and the ability to be operated at relatively high clocking rates. The fourth tap output of each shift register is fed back to the data in (Din) terminal. The load input terminal of each register 42A . . . 42F is connected to receive the load signal from the load circuit 40. The first and third taps (identified as taps 1 and 13) of shift register 42a are input to the pixel clock flip flop 32. This synchronizes the time slot generator output with the CCD element period.

A four-bit parallel input pattern P2 is loaded into each shift register 42A . . . 42F during, for example, a horizontal blanking time. In this embodiment, a fixed binary integer 1000 is loaded into each register 42A . . . 42F. The outputs of the six shift registers 42A . . . 42F are time interleaved to form the output timing relationships shown in FIG. 5, which also shows the relationship of the time slots to the CD element period (1X ECK) and its double frequency (2X ECK). These relationships will proportionately remain the same independent of the frequency used for the master oscillator 30.

Figure 6A:
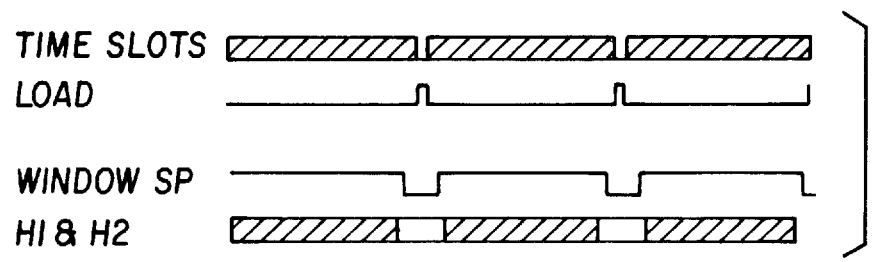
FIGS. 6A and 6B are waveform diagrams showing two different techniques for initializing the time slot generator shown in FIG. 2.
Figure 6B:
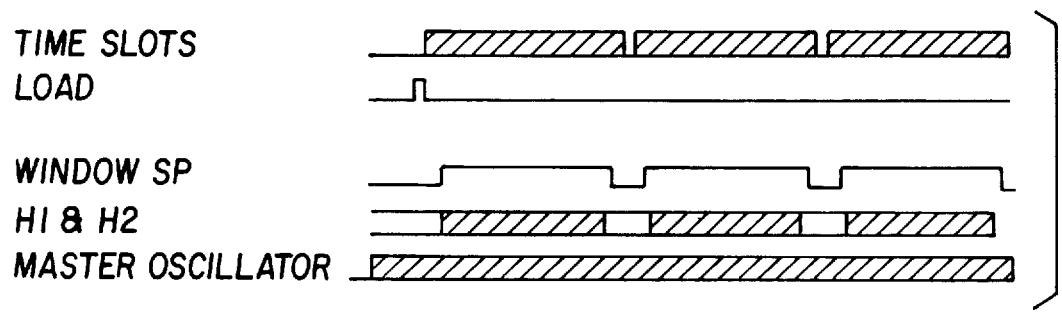

Loading, or initialization, of the time slot generator shown in FIG. 2 can be obtained in one of two ways, as shown in FIGS. 6A and 6B. First, as shown in FIG. 6A, the clock waveform design can be loaded every line. This is done during the vertical to horizontal transfer interval when the horizontal phase clocks of the sensor are idle and no output from the time slot generator is required. Secondly, as shown in FIG. 6B, the circuit can be initialized once during power up. If the time slot generator is powered down, it must be reinitialized. After the load pulse is deasserted, the clock generator design shown in FIG. 2 takes one element time (24 master clock cycles) to stabilize. Therefore the load pulse must be applied at a time that no output from the circuit is required (for at least one element time).

Furthermore, the performance of the load circuit 40 is dependent on the load function required by the shift registers. If the registers are synchronous load types, the load circuit 40 must first load register 38 and then load all the other registers 42A . . . 42F. This is shown in FIG. 4. FIG. 2 also shows the first and third tap outputs of the shift register 42A going to the register 32. This is provided to guarantee correct and controlled alignment of the clock signal 1X ECK to the output of the time slot generator. It is important that this relationship be undisturbed from one load operation to the next load operation.

Figure 1A:
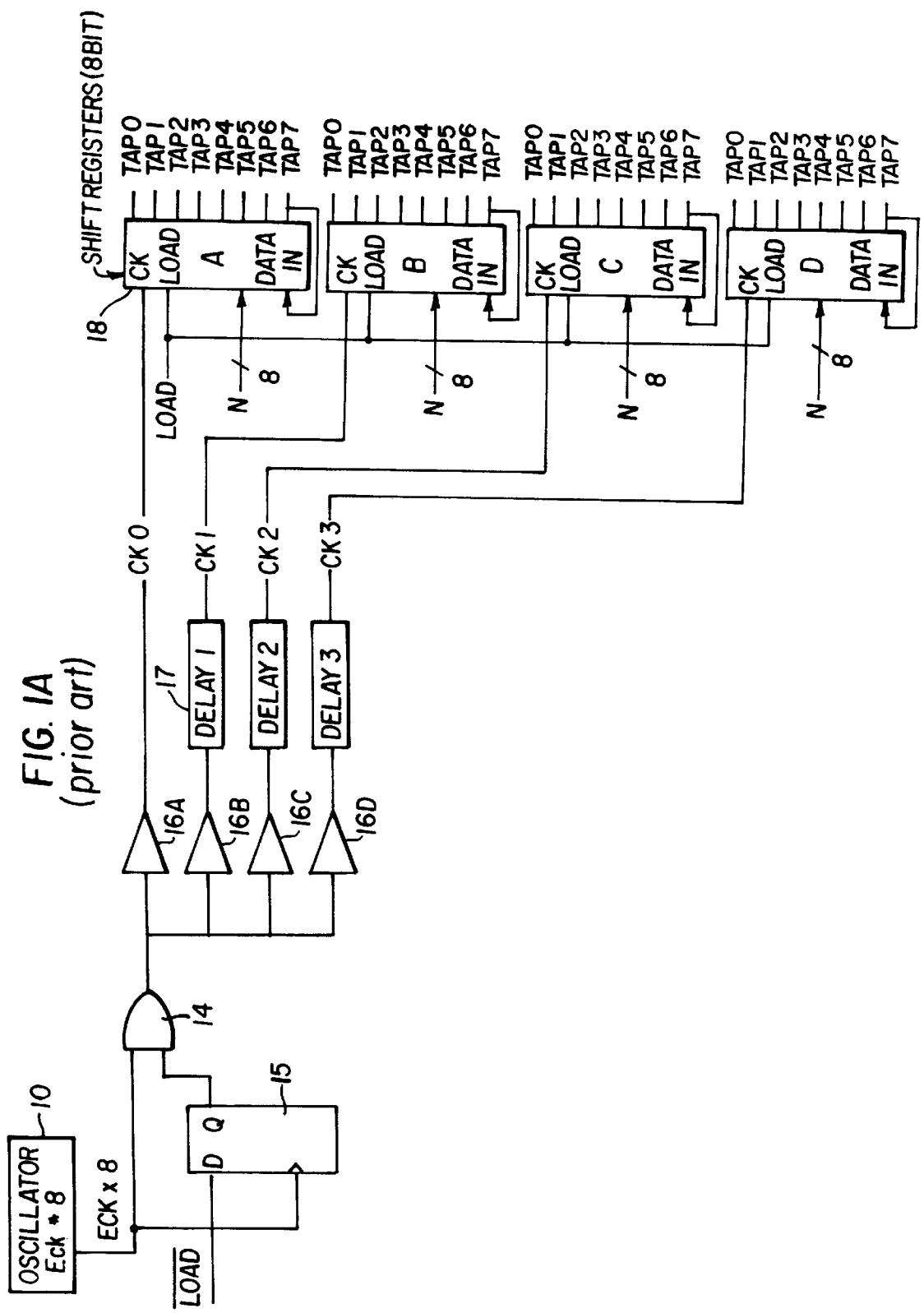
FIGS. 1A and 1B together show the logic design for a clock synthesizer known in the prior art.
Figure 1B:
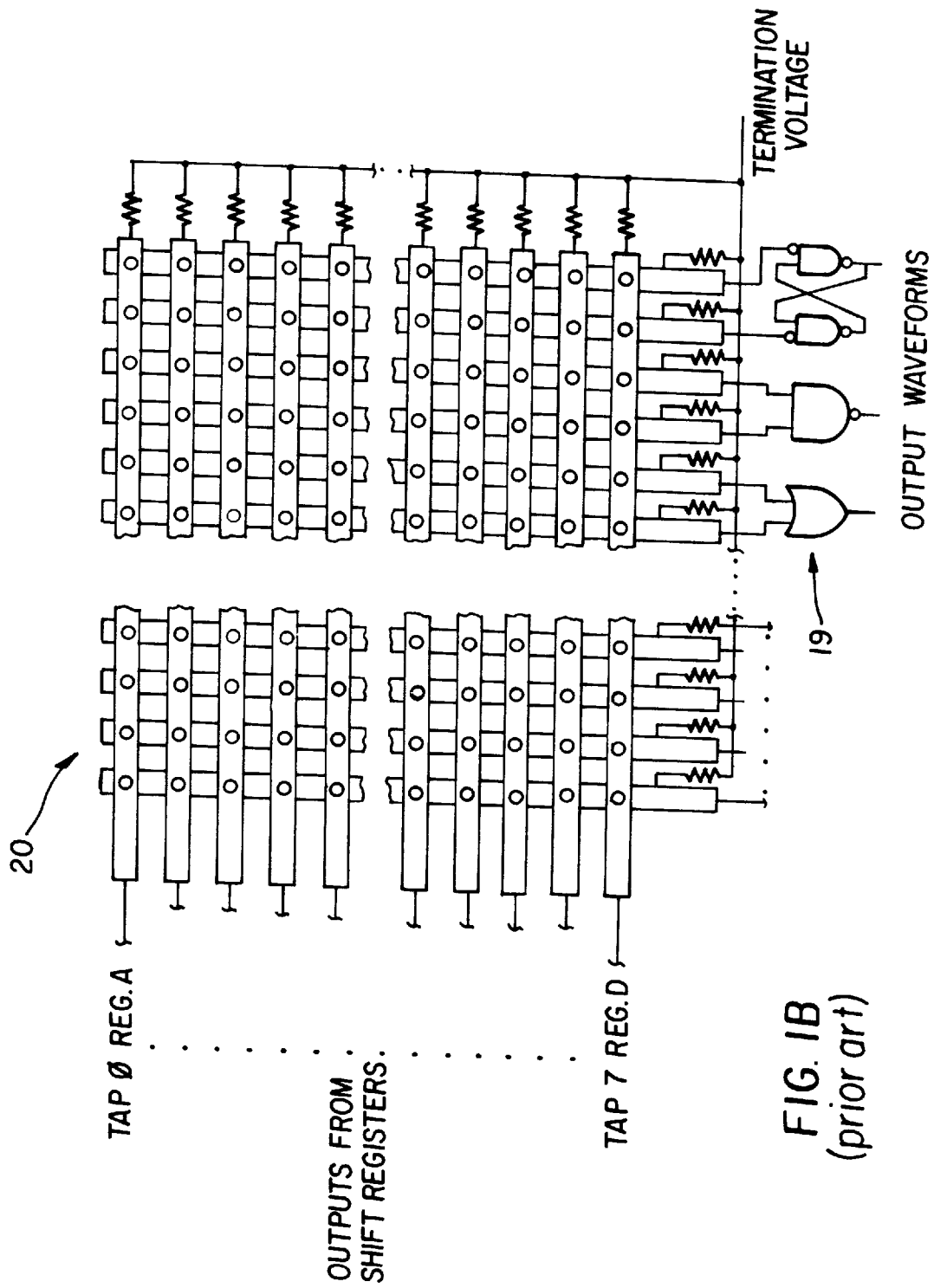

FIG. 3 shows an output waveform generation section similar in purpose to the circuit shown in FIG. 1B. Unlike FIG. 1B, however, FIG. 3 shows a programmable setup section 50 for identifying the tap pulses from the time slot shift registers 42A . . . 42F that are used to generate the output waveforms, in combination with a logic section 52 for combining the selected pulses to generate the output waveforms. For each output clock pulse, a time slot is selected in the setup section 50 to generate the rising edge and another time slot is selected to generate the falling edge. A plurality of five-bit serially-loaded set up registers 54 store the addresses for each edge, (which time slot), with each five-bit register storing the address for one edge. The edge addresses are serially loaded by the microprocessor 28 (see FIG. 7). A plurality of 1 of 24 select logic blocks 56 provide the actual logical path to the logic section 52. The time slots from the time slot generator of FIG. 2 are wired into the select logic blocks 56 so as to be accessible to the set up registers 54 and the logic section 52.

Figure 5:
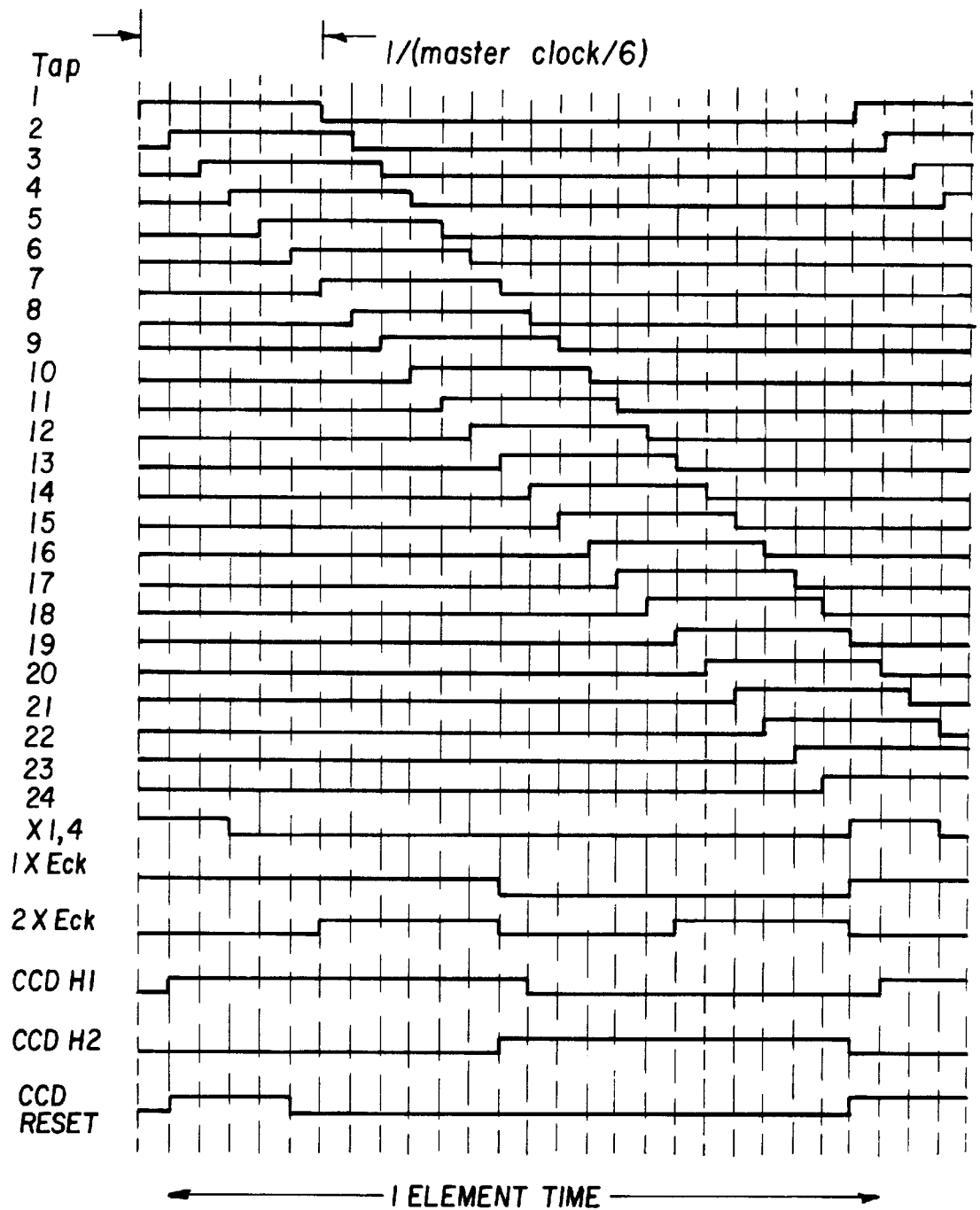
FIG. 5 is a timing diagram showing the output of the time slot generator and the output waveform generator shown in FIGS. 2 and 3, respectively.

The logic section 52 is composed of a plurality of D-type output flip flops 58, and the select logic blocks 56 provide the circuit paths to the flip flops 58. The output flip flops 58 are configured in the "clock and clear" configuration. When a corresponding window signal (Window SP, Window Convert, Window H1, Window Reset, FDG, and Window H2) is high, the desired clock is generated. When the Window signal is low, the clock is stopped in its correct state. These window signals are conventionally provided in a CCD imaging circuit. As shown in the timing diagram in FIG. 5, the logic section 52 produces a typical set of clocking signals for an image sensor, including the clamp, sample, convert, reset, and H1, H2 signals. FIG. 5 in particular shows the combination of time slot edges that are used to produce H1, H2, and Reset signals.

The invention has been described with reference to a preferred embodiment. However, it will be appreciated that variations and modifications can be effected by a person of ordinary skill in the art without departing from the scope of the invention.

PARTS LIST
10 oscillator
14 AND gate
15 D-type flip flop
16A . . . D buffers
17 delay lines
18 shift registers
19 waveform generating logic
20 physical interconnection matrix
21 imaging device
22 clock generator
23 image sensor
23a input clock signals
24 optical section
25 analog processing section
26 A/D converter
27 digital processing section
28 microprocessor
30 master oscillator
32 flip flop
34 programmable divider
36 prescale divider
38 shift register
40 load circuit
42A . . . 42F time slot shift registers
50 setup section
52 logic section
54 setup registers
56 1 of 24 select logic blocks
58 D-type output flip flops

The invention claimed is:

1. A programmable clock synthesizer circuit for generating a plurality of lower frequency clock pulses from a higher frequency clock, said synthesizer circuit comprising:
   first means for dividing the higher frequency clock by a first integer number to produce said first integer number of first phase shifted signals;
   second means for dividing each of said first phase shifted signals by a second integer number to produce said second integer number of second phase shifted signals from each said first phase shifted signal, said second phase shifted signals having a frequency equal to said higher frequency clock divided by a product of said first and second integer numbers;
   means for generating said plurality of lower frequency clock pulses from said second phase shifted signals; wherein said first means and said second means are programmable to produce said first and second phase shifted signals having selectively variable pulse periods; and
   a load circuit for synchronizing an external load pulse with said higher frequency clock for initially programming said first means for dividing and said second means for dividing.

2. The synthesizer circuit as claimed in claim 1 wherein said first means for dividing comprises a first recirculating shift register parallel loaded with a first binary pattern.

3. The synthesizer circuit as claimed in claim 2 wherein said first recirculating shift register has a plurality of parallel output taps and said first phase shifted signals are taken from each output tap of the shift register.

4. The synthesizer circuit as claimed in claim 1 wherein said second recirculating means for dividing comprises a plurality of second recirculating shift registers each parallel loaded with a second binary pattern clocked by one of the first phase shifted signals.

5. The synthesizer circuit as claimed in claim 4 wherein each second recirculating shift register has a plurality of parallel output taps and said second phase shifted signals are taken from the output taps of the plurality of said second recirculating shift registers.

6. The synthesizer circuit as claimed in claim 1 wherein said means for generating comprises a plurality of programmable registers loaded with addresses for selecting said second phase shifted signals.

7. The synthesizer circuit as claimed in claim 6 wherein each of said second phase shifted signals has time separated rising and falling edges, and wherein said programmable registers are loaded with said addresses for selecting said rising and falling edges to form the lower frequency clock pulses.

8. The synthesizer circuit as claimed in claim 6 wherein said means for generating further comprises a plurality of output flip-flops for generating the lower frequency clock pulses and in response to the addresses in the programmable registers for selecting the second phase shifted signals to connect to the output flip-flops.

9. The synthesizer circuit as claimed in claim 1 wherein said generating means includes selection logic means to select from the plurality of second phase shifted signals to generate lower frequency clock pulses.

10. A multiple clock synthesizer circuit for generating lower frequency clock pulses from a higher frequency clock signal, said clock synthesizer circuit comprising:
   an oscillator section for providing a train of pulses having leading and trailing edge transitions which correspond to transitions of a master clock signal;

a first register coupled to said oscillator for dividing the train of pulses by a fixed integer to produce a plurality of first phase shifted signals corresponding in number to said fixed integer;

a plurality of second shift registers corresponding in said number to said fixed integer and each having a clocking input coupled to a respective one of said first phase shifted signals, and producing a plurality of second phase shifted signals having leading and trailing edge transitions and having successive leading edge transitions separated from each other by time displacements corresponding to the transitions of the master clock signal;

an output waveform generation section for combining said plurality of second phase shifted signals to generate the lower frequency clock pulses; wherein said first shift register and said plurality of said second shift registers are programmable to produce said first and second phase shifted signals having selectively variable pulse periods; and a load circuit for synchronizing an external load pulse with said master clock signal for initially programming said first register and said second registers.

11. The synthesizer circuit as claimed in claim 10 wherein said first register comprises a first recirculating shift register parallel loaded with a first binary pattern.

12. The synthesizer circuit as claimed in claim 11 wherein said first recirculating shift register has a plurality of parallel output taps and said first phase shifted signals are taken from each output tap of the first recirculating shift register.

13. The synthesizer circuit as claimed in claim 10 wherein said second shift registers comprises a plurality of second recirculating shift registers each parallel loaded with a second binary pattern.

14. The synthesizer circuit as claimed in claim 13 wherein each second recirculating shift register has a plurality of parallel output taps and said second phase shifted signals are taken from the output taps of the plurality of said second recirculating shift registers.

15. The synthesizer circuit as claimed in claim 10 wherein said output waveform generation section includes a plurality of programmable registers loaded with addresses for selecting said second phase shifted signals.

16. The synthesizer circuit as claimed in claim 15 wherein each of said second phase shifted signals has time separated rising and falling edges and wherein said programmable registers are loaded with said addresses for selecting said rising and falling edges to form the lower frequency clock pulses.

17. The synthesizer circuit as claimed in claim 15 wherein said output waveform generation section further includes a plurality of output flip-flops for generating the lower frequency clock pulses and in response to the addresses in the programmable registers for selecting the second phase shifted signals to connect to the output flip-flops.

* * * * *